(12) United States Patent
Saitou et al.

(10) Patent No.: US 6,756,814 B2
(45) Date of Patent: Jun. 29, 2004

(54) LOGIC CIRCUIT AND SEMICONDUCTOR DEVICE

(75) Inventors: Yoshikazu Saitou, Hamura (JP); Kenichi Osada, Kawasaki (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/345,242

(22) Filed: Jan. 16, 2003

(65) Prior Publication Data

US 2003/0141905 A1 Jul. 31, 2003

(30) Foreign Application Priority Data

Jan. 31, 2002 (JP) .................................. 2002-022760

(51) Int. Cl.[7] .......................................... H03K 19/175
(52) U.S. Cl. ...................... 326/81; 326/119; 326/121; 326/83
(58) Field of Search ....................... 326/33, 34, 81, 326/83, 119, 121; 327/391, 530, 534, 546; 257/347, 349, 350

(56) References Cited

U.S. PATENT DOCUMENTS

| | | | | |
|---|---|---|---|---|
| 5,594,371 A | * | 1/1997 | Douseki | ................... 326/119 |
| 5,970,018 A | | 10/1999 | Iwata et al. | |
| 6,078,195 A | | 6/2000 | Chen | |
| 6,208,171 B1 | | 3/2001 | Kumagai et al. | |
| 6,232,793 B1 | * | 5/2001 | Arimoto et al. | ................ 326/34 |
| 6,242,948 B1 | * | 6/2001 | Makino | ...................... 326/81 |
| 6,404,254 B2 | | 6/2002 | Iwaki et al. | |
| 6,414,363 B1 | | 7/2002 | Mizuguchi et al. | |
| 6,635,934 B2 | * | 10/2003 | Hidaka | ...................... 257/369 |
| 6,674,127 B2 | * | 1/2004 | Kotani | ...................... 257/347 |
| 2002/0084804 A1 | | 7/2002 | Horiguchi et al. | |

FOREIGN PATENT DOCUMENTS

| | | |
|---|---|---|
| JP | 5-291929 | 4/1992 |
| JP | 6-334010 | 5/1993 |
| JP | 7-38417 | 7/1993 |
| JP | 7-86916 | 9/1993 |
| JP | 7-244982 | 3/1994 |
| JP | 10-51296 | 8/1996 |
| JP | 11-112297 | 10/1997 |
| JP | 10-208473 | 11/1997 |
| JP | 11-17522 | 5/1998 |
| JP | 2000-101418 | 9/1998 |
| JP | 2000-124785 | 10/1998 |
| JP | 2000-13215 | 4/1999 |
| JP | 2000-151386 | 6/1999 |
| JP | 2001-143477 | 11/1999 |

\* cited by examiner

*Primary Examiner*—Vibol Tan
(74) *Attorney, Agent, or Firm*—Reed Smith LLP; Stanley P. Fisher, Esq.; Juan Carlos A. Marquez, Esq.

(57) ABSTRACT

The present invention is directed to simplify a circuit for fixing an output logic of a logic gate while suppressing a subthreshold current. A logic circuit has an n-channel type first transistor capable of interrupting power supply to a logic gate in accordance with an input control signal, and a p-channel type second transistor capable of fixing an output node of the logic gate to a high level interlockingly with the power supply interrupting operation by the first transistor, and a threshold of the first transistor is set to be higher than that of a transistor as a component of the logic gate. Means for interrupting the power supply to the logic gate is realized by the first transistor, and means for fixing an output node of the logic gate to the high level is realized by the second transistor, thereby simplifying the circuit for fixing the output logic of the logic gate while suppressing a subthreshold current.

28 Claims, 13 Drawing Sheets

FIG. 13

|  |  | LV-CMOS | LV-TTL |
|---|---|---|---|
| OUTPUT DRIVER CIRCUIT 201 | SETTING CIRCUIT | ○ | ○ |
|  | RESETTING CIRCUIT | − | − |
| OUTPUT DRIVER CIRCUIT 202 | SETTING CIRCUIT | ○ | × |
|  | RESETTING CIRCUIT | ○ | ○ |
| OUTPUT DRIVER CIRCUIT 203 | SETTING CIRCUIT | ○ | × |
|  | RESETTING CIRCUIT | ○ | × |

FIG. 17

| DATA | DOC | CSB | Test | CTL | P0 | P01 | N0 | N01 | OUT |
|------|-----|-----|------|-----|----|----|----|----|-----|
| X | X | H | X | X | H | H | L | L | HZ |
| X | X | X | H | X | H | H | L | L | HZ |
| X | H | L | L | X | H | H | L | L | HZ |
| L | L | L | L | L | H | H | H | H | L |
| H | L | L | L | L | L | L | L | L | H |
| L | L | L | L | H | H | H | H | L | L |
| H | L | L | L | L | H | L | H | L | H |

L: LOW LEVEL
H: HIGH LEVEL
HZ: HIGH IMPEDANCE
X: UNDEFINED

LOGIC CIRCUIT AND SEMICONDUCTOR DEVICE

BACKGROUND OF THE INVENTION

The present invention relates to a logic circuit and a semiconductor device including the logic circuit and, more particularly, to a circuit adapted to a low-power operation.

As an MOS transistor is becoming finer, its breakdown voltage decreases, so that the operation voltage has to be lowered. In this case, in order to maintain high processing speed of the MOS transistor, the threshold voltage of the MOS transistor has to be lowered in accordance with the decrease in the operation voltage for the reason that the operation speed is controlled by an effective gate voltage of the MOS transistor, that is, a value obtained by subtracting the threshold voltage of the MOS transistor from the operation voltage. The larger the value is, the higher the processing speed is. When the threshold voltage is set to about 0.4V or less, however, the MOS transistor cannot be completely turned off due to a subthreshold characteristic (tailing characteristic) of the MOS transistor and a phenomenon occurs such that an undesired direct current flows. Due to such a phenomenon, a substantial direct current of a semiconductor integrated circuit constructed by a number of MOS transistors remarkably increases. Particularly, at the time of high-temperature operation, the threshold voltage of the MOS transistor is low and a tailing factor is high, so that the phenomenon caused by the subthreshold characteristic becomes more serious. In consideration of such circumstances, the applicant herein has proposed a high-speed low-power semiconductor integrated circuit with a finer MOS transistor (Japanese Unexamined Patent Application No. Hei 7(1995)-86916 which corresponds to U.S. Pat. No. 2002/084804). In the semiconductor integrated circuit, control means for controlling a current supply of a large current and a small current is inserted between the source of a MOS transistor and a power source, and the current is supplied to the MOS transistor while switching the currents in accordance with a use, thereby suppressing a subthreshold current which flows in a standby mode (also called "subthreshold leak current").

SUMMARY OF THE INVENTION

The inventor herein has examined the semiconductor integrated circuit (Japanese Unexamined Patent Application No. Hei 7(1995)-86916) proposed by the applicant herein and found that there is room for improvement in the circuit configuration for fixing an output logic.

In the semiconductor integrated circuit proposed by the applicant herein, control means for controlling current supply of a large current and a small current is inserted between a logic circuit having a predetermined function and a power source (VCC, VSS). While switching the current between the large current and the small current by the control means, a current is supplied to the logic circuit. In the case where a path of a current to the logic circuit is interrupted, an output of the logic circuit is held by a level holding circuit. The level holding circuit is formed by connecting two inverters in each of which a p-channel type MOS transistor and an n-channel type MOS transistor are connected in series in a loop shape. The level holding circuit holds an output logic at the time when the current path to the logic circuit is interrupted. Since the holding circuit is formed by connecting two inverters in a loop shape as described above, four MOS transistors are necessary. As a MOS transistor is becoming finer, a number of circuits in which subthreshold current has to be suppressed exist in a semiconductor integrated circuit and, accordingly, a number of holding circuits are necessary. Therefore, the number of MOS transistors even only in the holding circuits is huge.

An object of the present invention is to provide a technique of simplifying a circuit for fixing an output logic of a logic gate while suppressing a subthreshold current.

The above and other objects of the invention and novel features will become apparent from the description of the specification and attached drawings.

An outline of representative ones of inventions disclosed in the specification will be briefly described as follows.

A logic circuit has: an n-channel type first transistor provided between a second power supply terminal and a low-potential-side power and capable of interrupting power supply to the logic gate in accordance with an input control signal; and a p-channel type second transistor provided between a high-potential-side power and an output node of the logic gate and capable of fixing the output node of the logic gate to the high level interlockingly with the power supply interrupting operation of the first transistor, and a threshold voltage of the first transistor is set to be higher than that of the transistor as a component of the logic gate. As a MOS transistor is becoming finer, its breakdown voltage decreases, so that the operation voltage has to be lowered. In order to maintain high-speed switching operation of a transistor, the threshold voltage of the transistor has to be decreased in accordance with the decrease in the operation voltage.

According to the means, the first transistor interrupts the power supply to the logic gate and the second transistor fixes the output node of the logic gate to the high level interlockingly with the power supply interrupting operation. Consequently, a circuit for fixing the output logic of the logic gate while suppressing the subthreshold current is constructed by the first and second transistors, thereby achieving simplification of the circuit. In this case, by setting the threshold voltage of the first transistor to be higher than that of the transistor as a component of the logic gate, reduction in the subthreshold current in the first transistor is assured.

A logic circuit includes: an n-channel type first transistor provided between a second power supply terminal and a low-potential-side power and capable of interrupting power supply to a logic gate in accordance with an input control signal; and an n-channel type second transistor provided between the low-potential-side power and an output node of the logic gate and capable of fixing the output node of the logic gate to the low level interlockingly with the power supply interrupting operation of the first transistor, and a threshold voltage of the first transistor is set to be higher than that of the transistor as a component of the logic gate.

According to the means, the first transistor interrupts the power supply to the logic gate and the second transistor fixes the output node of the logic gate to the high level interlockingly with the power supply interrupting operation. Consequently, a circuit for fixing the output logic of the logic gate while suppressing the subthreshold current is constructed by the first and second transistors, thereby achieving simplification of the circuit. In this case, by setting the threshold voltage of the first transistor to be higher than that of the transistor as a component of the logic gate, reduction in the subthreshold current in the first transistor is assured.

BRIEF DESCRIPTION OF THE DRAWINGS

FIG. 13 is a diagram explaining an example of operation of the output driver.

FIG. 17 is a diagram explaining operation of the main part of an output driver and an output buffer.

DETAILED DESCRIPTION OF THE PREFERRED EMBODIMENTS

Figure 1:
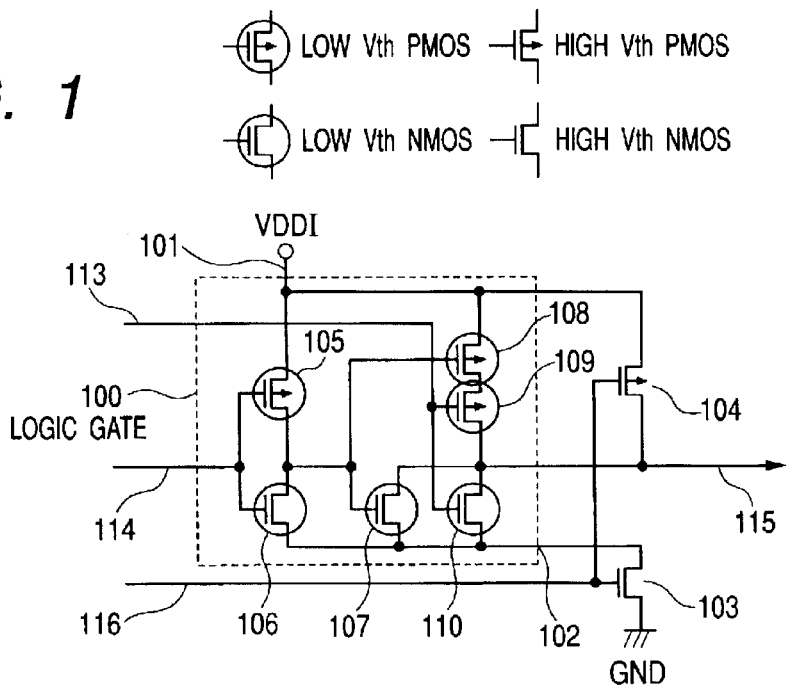
FIG. 1 is a circuit diagram showing an example of the configuration of a logic circuit according to the invention.

FIG. 1 shows an example of the configuration of a logic circuit according to the invention.

A logic circuit shown in FIG. 1 includes, although not particularly limited, a logic gate 100 having a predetermined function, and an n-channel type MOS transistor 103 and a p-channel type MOS transistor 104 which are connected to the logic gate 100.

Although not particularly limited, the logic gate 100 is constructed as follows.

The logic gate 100 has a first power supply terminal 101 to which a high-potential-side power VDDI is supplied and a second power supply terminal 102 to which a low-potential-side power (ground GND) is supplied. The high-potential-side power VDDI is obtained by decreasing a high-potential-side power VCC supplied from the outside by a not-shown step-down circuit.

The logic gate 100 is constructed as follows.

A p-channel type MOS transistor 105 and an n-channel type MOS transistor 106 are connected in series, thereby forming an inverter for inverting the logic of an input signal 114. The source electrode of the p-channel type MOS transistor 105 is connected to the high-potential-side power source VDDI, and the source electrode of the n-channel type MOS transistor 106 is connected to the second power supply terminal 102. An output signal of the inverter is transmitted to the gate electrodes of a p-channel type MOS transistor 108 and an n-channel type MOS transistor 107. The p-channel type MOS transistor 108, a p-channel type MOS transistor 109 and an n-channel type MOS transistor 110 are connected in series. The source electrode of the p-channel type MOS transistor 108 is connected to the first power supply terminal 101 and the source electrode of the n-channel MOS transistor 110 is connected to the second power supply terminal 102. To the gate electrodes of the p-channel type MOS transistor 109 and the n-channel type MOS transistor 110, a control signal 113 is transmitted. From a series connection point of the p-channel type MOS transistor 109 and the n-channel type MOS transistor 110, an output node 115 of the logic gate 100 is led.

The n-channel type MOS transistor 103 is provided between the second power supply terminal 102 and the low-potential-side power source (GND) and can interrupt power supply to the logic gate 100 in accordance with an input control signal 116. Specifically, when the control signal 116 is at the high level, the n-channel type MOS transistor 103 is turned on and the second power supply terminal 102 is connected to the ground GND, thereby enabling the low-potential-side power to be supplied. When the control signal 116 is at the low level, the n-channel type MOS transistor 103 is turned off, so that power supply to the logic gate 100 is interrupted. By the interruption of the power supply, the logic gate 100 enters a non-operative state (standby state). In the case where the power supply to the logic gate 100 is interrupted, in order to prevent the logic of the output node 115 of the logic gate 100 from becoming undefined, the p-channel type MOS transistor 104 is turned on interlockingly with the power supply interrupting operation of the n-channel type MOS transistor 103, thereby fixing the logic of the output node 115 at the high level.

Figure 4:
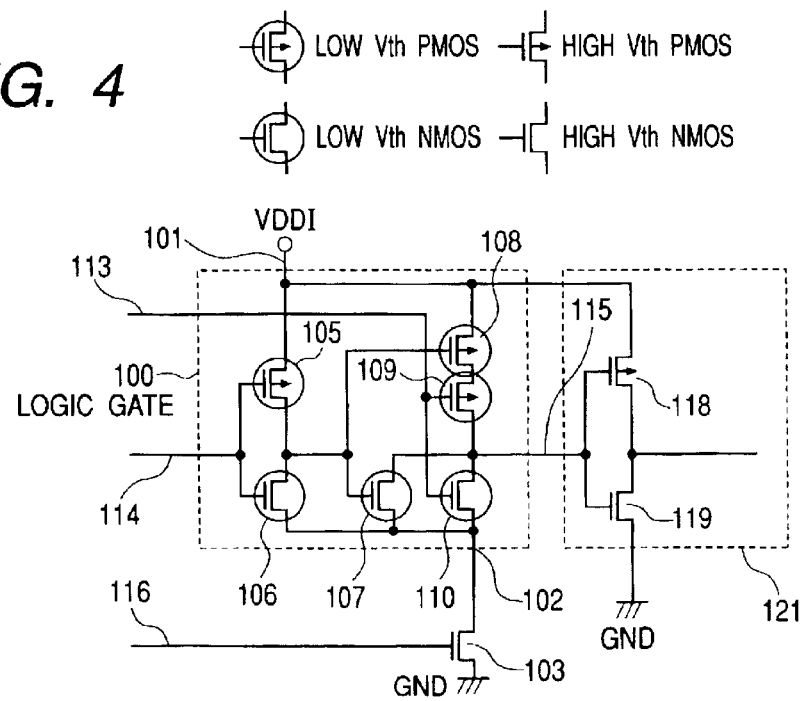
FIG. 4 is a circuit diagram showing an example of the configuration of a circuit to be compared with the logic circuit.

In the case where the p-channel type MOS transistor 104 does not exist, the logic of the node 115 becomes undefined or goes high extremely slowly. Consequently, for example, as shown in FIG. 4, in the case where a logic gate 121 is disposed in a post stage of the logic gate 100, a logic operation of the logic gate 121 is disturbed or a feed-through is passed to a series circuit of a p-channel type MOS transistor 118 and an n-channel type MOS transistor 119 forming a first input stage. In the case where the power supply to the logic gate 100 is interrupted, the p-channel type MOS transistor 104 shown in FIG. 1 operates to fix the output node 115 of the logic gate 100 at the high level so that the logic of the output node does not become undefined.

The threshold voltage of each of the MOS transistors 105, 106, 107, 108, 109, and 110 constructing the logic gate 100 is set to be low. In contrast, the threshold voltage of each of the n-channel type MOS transistor 103 and the p-channel type MOS transistor 104 is set to be higher than that of each of the MOS transistors 105, 106, 107, 108, 109, and 110. Since the breakdown voltage decreases as the MOS transistor becomes finer, the operation voltage of the MOS transistor has to be lowered. In order to maintain high processing speed, the threshold voltage of each of the MOS transistors 105, 106, 107, 108, 109, and 110 has to be decreased in accordance with the operation power supply voltage. On the other hand, the operation of a circuit for reducing a sub-threshold current of the MOS transistors constructing the logic gate 100 may be slow as compared with the logic gate 100. Consequently, the threshold voltage of each of the MOS transistors 103 and 104 is set to be higher than that of any of the MOS transistors constructing the logic gate 100, thereby reducing the subthreshold current of the MOS transistors 103 and 104. The threshold voltage of the MOS transistor is, although not particularly limited, controlled by changing the impurity concentration at the time of ion implantation.

As described above, by providing the p-channel type MOS transistor 104 between the high-pontential-side power source VDDI and the output node 115 of the logic gate 100-and turning on the p-channel type MOS transistor 104 interlockingly with the power supply interrupting operation of the n-channel type MOS transistor 103, the logic of the output node 115 of the logic gate 100 can be fixed to the high level. Thus, it becomes unnecessary to provide a holding circuit for holding the logic of the output node 115 of the logic gate 100. Since the holding circuit is formed by connecting the two inverters in a loop shape as described above, four MOS transistors are necessary. In the embodiment, one p-channel type MOS transistor is sufficient, so that the number of MOS transistors can be reduced. Since the threshold of each of the n-channel type MOS transistor 103 and the p-channel type MOS transistor 104 is set to be higher as compared with that of each of the MOS transistors 105, 106, 107, 108, 109, and 110, the subthreshold current in the n-channel type MOS transistor 103 and the p-channel type MOS transistor 104 is extremely small.

Another example of the configuration of the logic circuit will now be described.

Figure 2:
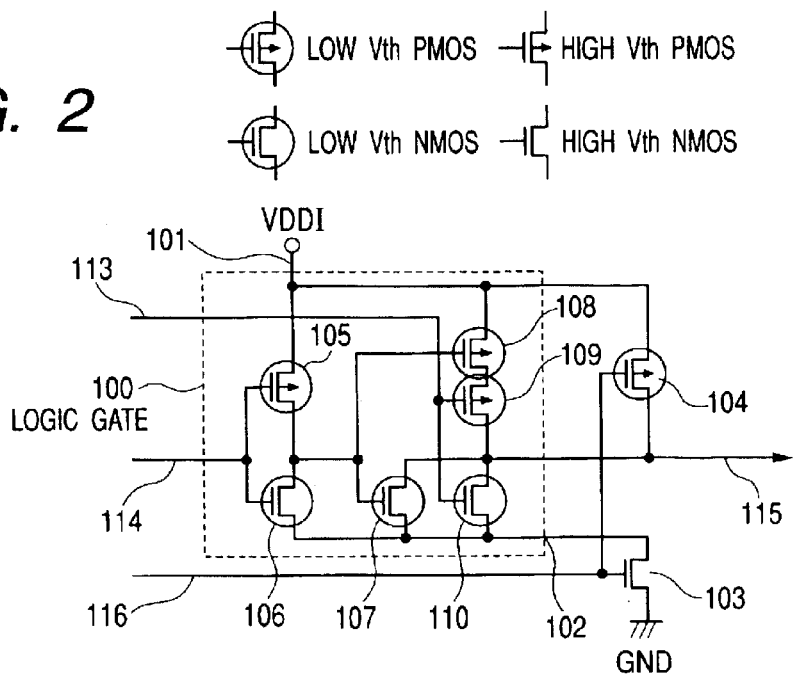
FIG. 2 is a circuit diagram showing another example of the configuration of the logic circuit.

FIG. 2 shows another example of the configuration of the logic circuit.

The logic circuit shown in FIG. 2 is largely different from that of FIG. 1 with respect to the point that the threshold voltage of the p-channel type MOS transistor 104 is set to be low in a manner similar to the MOS transistors constructing the logic gate 100. If the subthreshold current in an off state of the p-channel type MOS transistor 104 is within an allowable range, even if the threshold voltage of the p-channel type MOS transistor 104 is set to be low, there is no particular hitch.

Figure 3:
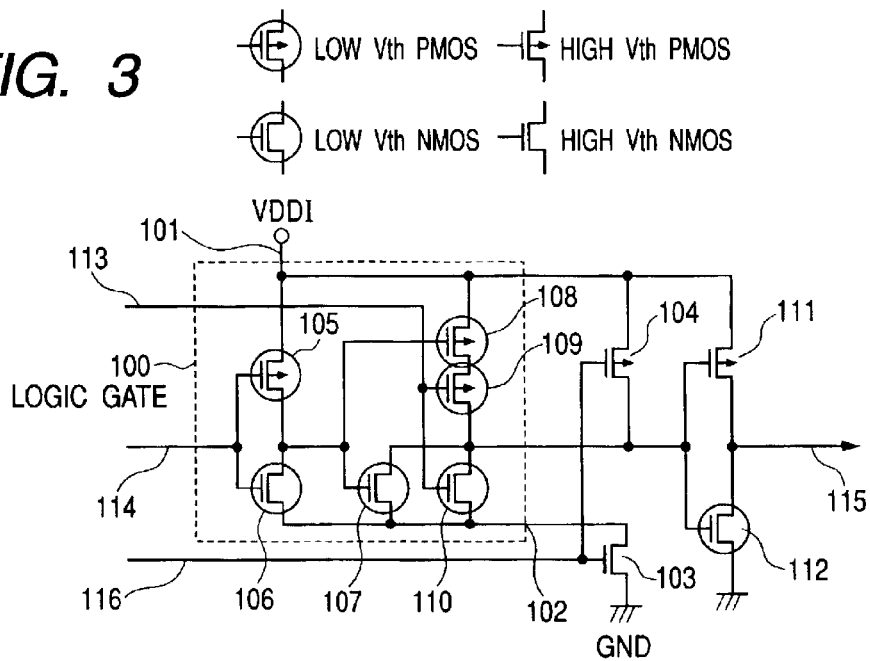
FIG. 3 is a circuit diagram showing another example of the configuration of the logic circuit.

When the user desires to fix the logic of the output node 115 at the high level, as shown in FIG. 3, it is sufficient to dispose an inverter formed by connecting a p-channel type MOS transistor 111 and an n-channel type MOS transistor 112 in series in a post stage of the logic gate 100, invert an output signal of the logic gate 100, and transmit the inverted signal to a post circuit.

Figure 5:
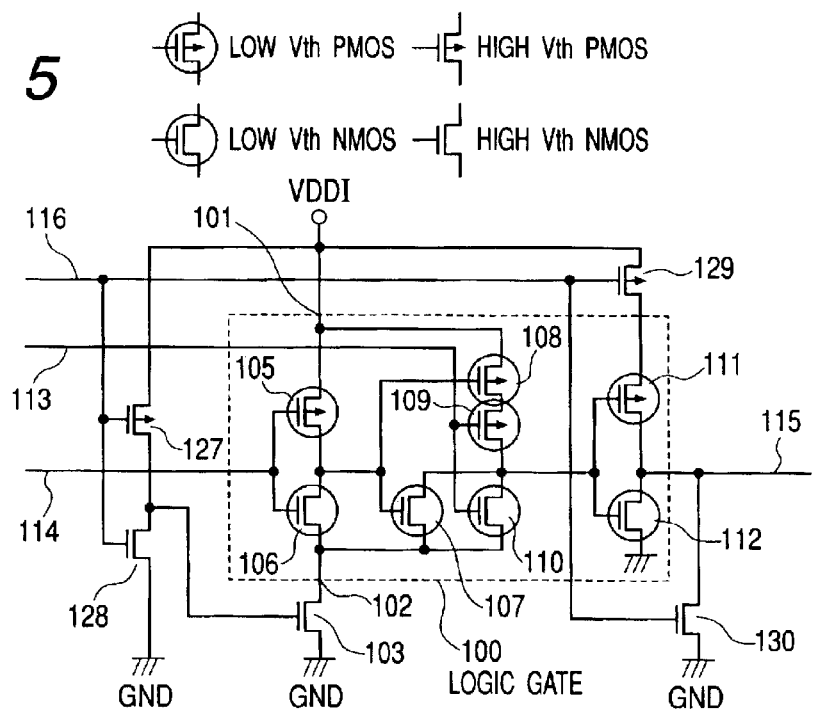
FIG. 5 is a circuit diagram showing another example of the configuration of the logic circuit.

As shown in FIG. 5, the logic of the output node 115 of the logic gate 100 may be fixed at the low level. In the configuration shown in FIG. 5, an inverter formed by connecting the p-channel type MOS transistor 111 and the n-channel type MOS transistor 112 in series is provided as a final-stage circuit in the logic gate 100. A p-channel type MOS transistor 129 of which operation is controlled by the control signal 116 is provided. By the p-channel type MOS transistor 129, power supply to the circuit obtained by connecting the p-channel type MOS transistor 111 and the n-channel type MOS transistor 112 in series is interrupted. In order to make the n-channel type MOS transistor 103 and an n-channel type MOS transistor 130 operate complementarily, an inverter formed by connecting a p-channel type MOS transistor 127 and an n-channel type MOS transistor 128 in series is provided, the control signal 116 is inverted by the inverter and the inverted signal is transmitted to the gate electrode of the n-channel type MOS transistor 103. For a reason similar to the above-described case, the threshold of each of the MOS transistors 103, 127, 128, 129, and 130 is set to be higher than that of each of the transistors constructing the logic gate 100.

In the configuration, when the control signal 116 is at the low level, the p-channel type MOS transistor 129 and the n-channel type MOS transistor 103 are turned on and the operation power is supplied to the circuit, so that the logic gate 100 is made operative. In contrast, when the control signal 116 is at the high level, the p-channel type MOS transistor 129 and the n-channel type MOS transistor 103 are turned off and the power supply to the circuit is interrupted, so that the logic gate 100 enters a standby mode.

Figure 6:
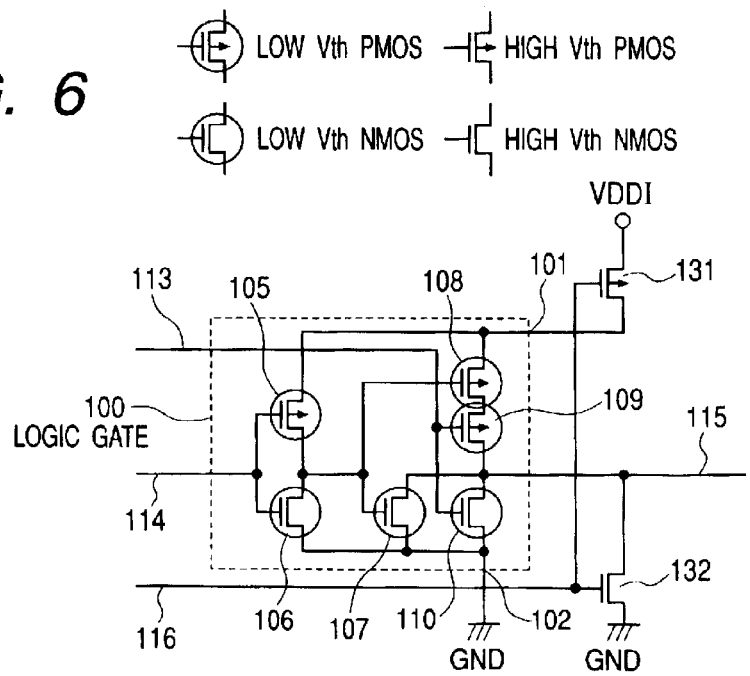
FIG. 6 is a circuit diagram showing another example of the configuration of the logic circuit.

In the configuration shown in FIG. 6, a p-channel type MOS transistor 131 and an n-channel type MOS transistor 132 of which operation is controlled by the control signal 116 are provided. The threshold voltage of each of the p-channel type MOS transistor 131 and the n-channel type MOS transistor 132 is set to be higher than that of each of the transistors constructing the logic gate 100 for a reason similar to that of the above case.

The p-channel type MOS transistor 131 is provided between the high-potential-side power source VDDI and the first power supply terminal 101 and interrupts the power supply to the logic gate 100 in accordance with the control signal 116. The n-channel type MOS transistor 132 is provided between the output node 115 of the logic gate 100 and the ground GND and fixes the output node 115 at the low level interlockingly with the interruption of power supply to the logic gate 100.

Figure 7:
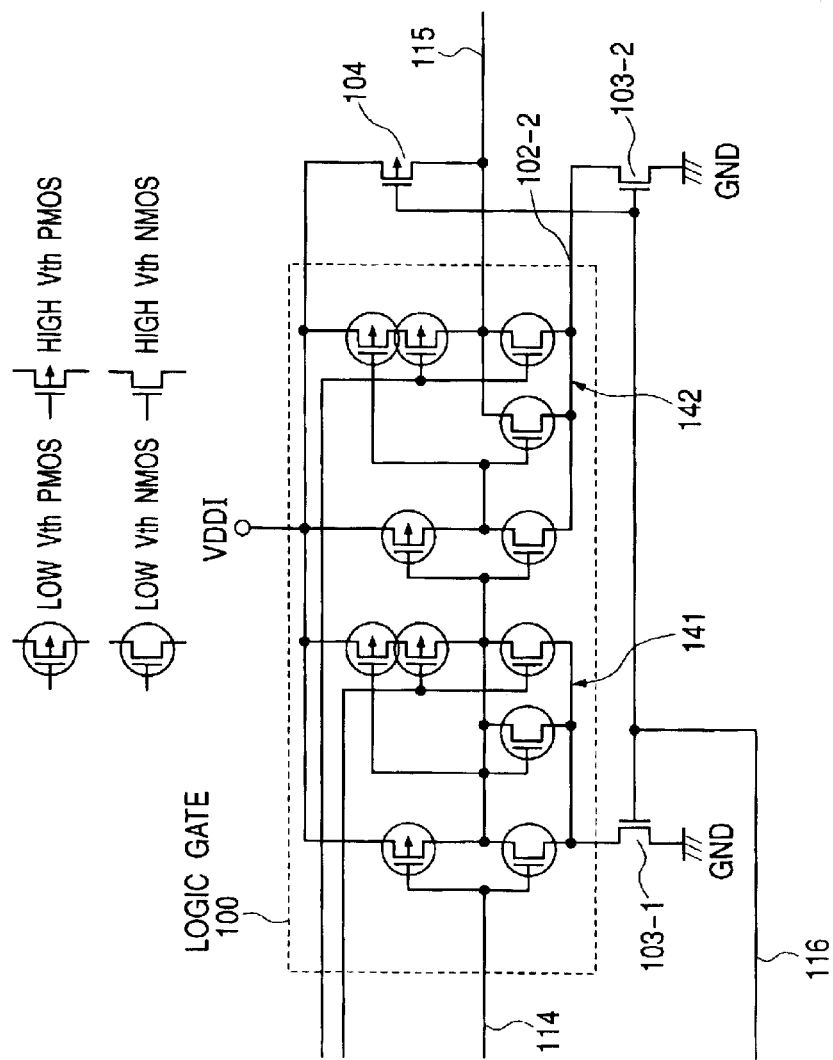
FIG. 7 is a circuit diagram showing another example of the configuration of the logic circuit.

When the number of elements of the logic gate 100 is large, an internal power source of the logic gate 100 is divided, a plurality of second power supply terminals are accordingly provided, and power is supplied from each of the terminals. For example, in the case shown in FIG. 7, the low-potential-side power source in the logic gate 100 is divided into a circuit block 141 and a circuit block 142 connected to the circuit block 141 and, accordingly, second power supply terminals 102-1 and 102-2 are provided. In correspondence with the terminals 102-1 and 102-2, n-channel type MOS transistors 103-1 and 103-2 are provided. The operation of the n-channel type MOS transistors 103-1 and 103-2 is controlled by the control signal 116, thereby enabling the power supply to the circuits 141 and 142 to be interrupted. For a reason similar to the above case, the threshold voltage of each of the n-channel type MOS transistors 103-1 and 103-2 is set to be higher than that of any of the transistors constructing the logic gate 100.

An example of application of the logic circuit according to the invention will now be described.

Figure 8:
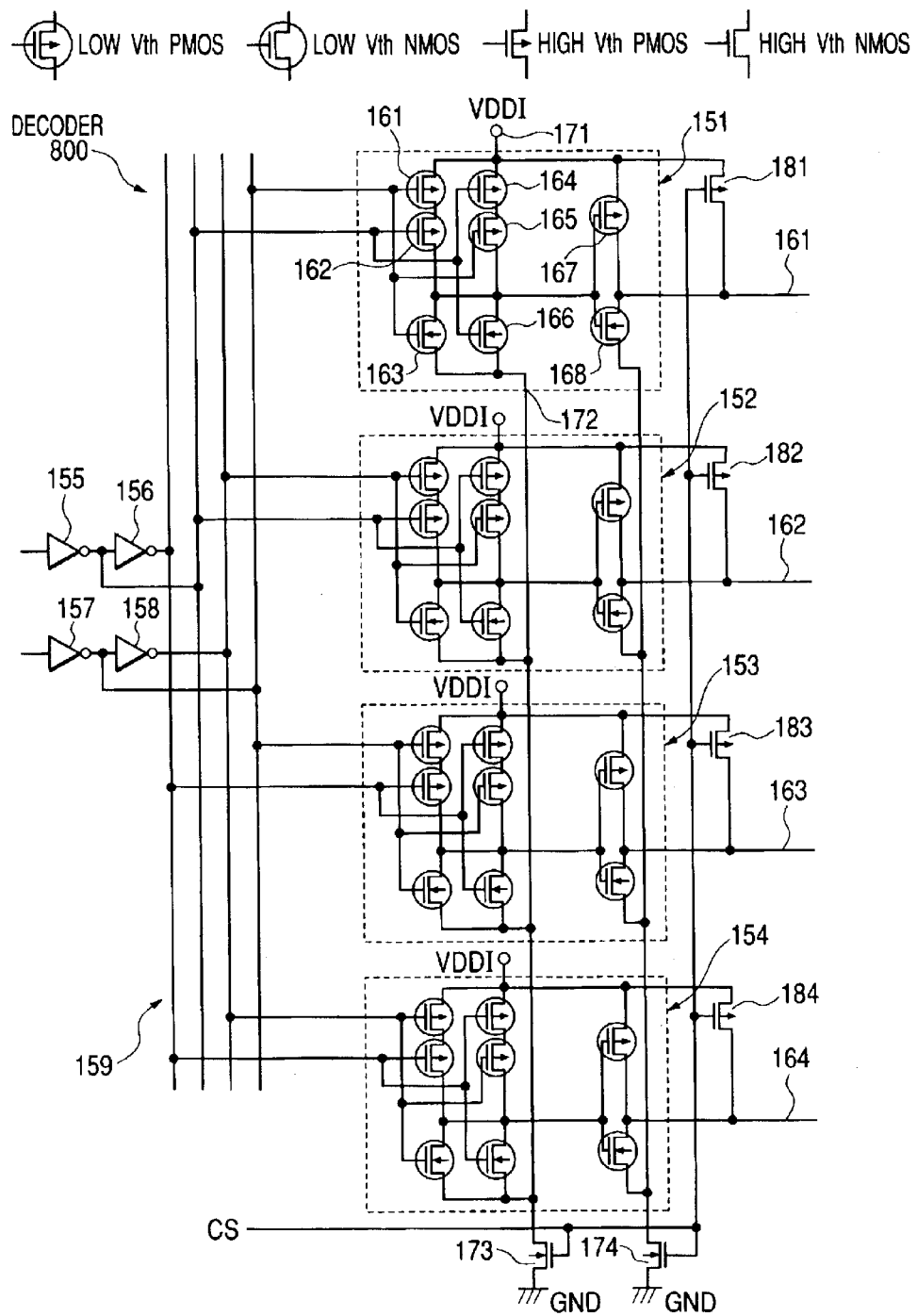
FIG. 8 is a circuit diagram showing an example of the configuration of a decoder to which the logic circuit according to the invention is applied.

FIG. 8 shows a decoder to which the logic circuit according to the invention is applied.

A decoder 800 has, although not particularly limited, a function of decoding a row address and a column address in a semiconductor storage device as an example of a semiconductor integrated circuit. The decoder 800 includes gates 155, 156, 157, and 158 constructing a buffer for receiving an address signal consisting of two bits, a decoding wire group 159 for decoding the received address signal, and a plurality of decode logics 151, 152, 153, and 154 for obtaining an decoded output according to a logic signal of the decoding wire group 159. In this case, the decode logics 151, 152, 153, and 154 are an example of the logic gate in the invention.

The decode logics 151, 152, 153, and 154 have the same configuration. For example, the decode logic 151 is formed by connecting p-channel type MOS transistors 161, 162, 164, 165, and 167 and n-channel type MOS transistors 163, 166, and 168. The radio W/L between a gate width (W) and a gate length (L) of each of the MOS transistors 161, 162, 164, and 165 is set to 3/01.6. The ratio W/L of each of the MOS transistors 163 and 166 is set to 2/0.16. The ratio W/L of the MOS transistor 167 is set to 24/0.16 and the ratio W/L of the MOS transistor 168 is set to 12/0.16. The decoder 800 has a first power supply terminal 171 to which the high-potential-side power VDDI is supplied and second power supply terminals 172 and 173 to which the low-potential-side power (GND) is supplied.

In correspondence with the second power supply terminals 172 and 173, n-channel type MOS transistors 173 and 174 are provided. Each of the n-channel type MOS transistors 173 and 174 interrupts the power supply to the decode logics 151, 152, 153, and 154 in accordance with a chip select signal CS. For output nodes 161, 162, 163, and 164 of the decode logics 151, 152, 153, and 154, p-channel type MOS transistors 181, 182, 183, and 184 capable of fixing the output nodes 161, 162, 163, and 164 at the high level interlockingly with the operation of interrupting the power supply to the decode logics 151, 152, 153, and 154 are provided. The W/L of each of the p-channel type MOS transistors 181, 182, 183, and 184 is 12/0.16.

The threshold voltage of each of MOS transistors constructing the decode logics 151, 152, 153, and 154 is set to be low so that high-speed operation can be performed even if the high-potential-side power source VDDI is low. In contrast, for a reason similar to the above case, the threshold voltage of each of the p-channel type MOS transistors 181, 182, 183, and 184 and the n-channel type MOS transistors 173 and 174 is set to be larger than that of each of the MOS transistors constructing the decode logics 151, 152, 153, and 154.

Figure 9:
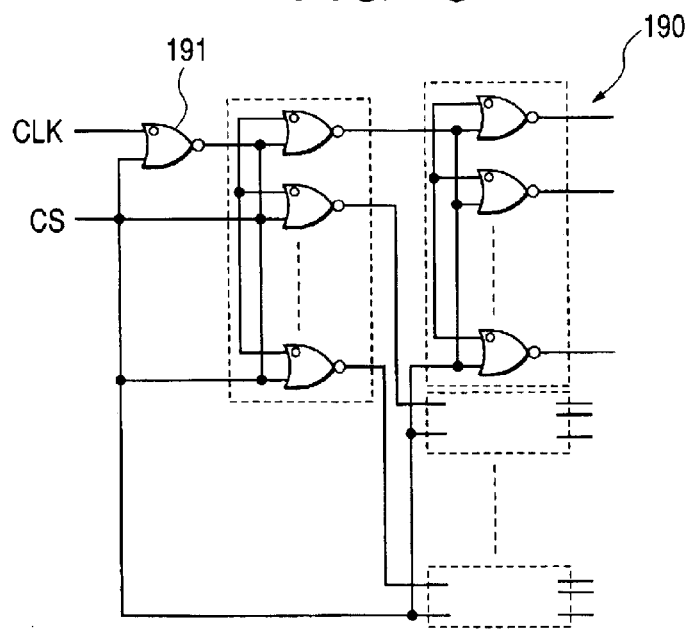
FIG. 9 is a circuit diagram showing an example of the configuration of a clock driver to which the logic circuit according to the invention is applied.

FIG. 9 shows a case where the logic circuit according to the invention is applied to a clock driver circuit.

A clock driver circuit 190 shown in FIG. 9 has, although not particularly limited, a function of distributing clock signals to functional modules in a semiconductor integrated circuit and is formed by connecting a plurality of 2-input logic gates 191. A clock signal CLK is input to one of input terminals of the 2-input gate 191 in the first input stage and the chip select signal CS is input to the other input terminal. To a 2-input logic gate positioned in the following stage, an output signal of the 2-input logic gate in the preceding stage and the chip select signal are input.

Figure 10:
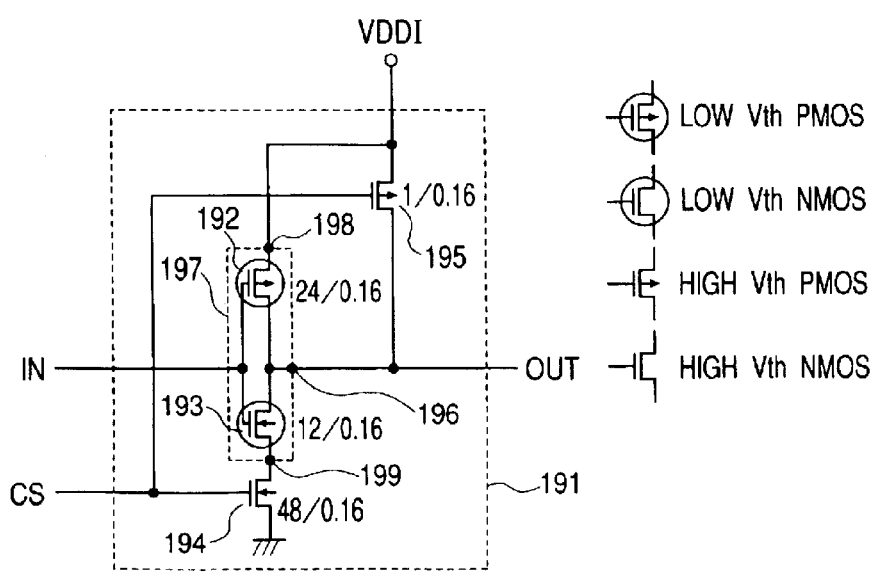
FIG. 10 is a circuit diagram showing an example of the configuration of a main part of the clock driver.

FIG. 10 shows the configuration of one of the plurality of 2-input logic gates 191. The 2-input logic gate 191 has an inverter 197 formed by connecting a p-channel type MOS transistor 192 and an n-channel type MOS transistor 193 in series. A first power supply terminal 198 of the inverter 197 is connected to the high-potential-side power source VDDI and a second power supply terminal 199 is connected to the ground GND via an n-channel type MOS transistor 194. The n-channel type MOS transistor 194 can interrupt power supply to the inverter 197 on the basis of the chip select signal CS. Between an output node 196 of the inverter 197 and the high-potential-side power source VDDI, a p-channel type MOS transistor 195 for fixing the output node 196 to the high level interlockingly with the operation of interrupting power supply to the inverter 107 is provided. The inverter 197 is an example of the logic gate of the invention. For a reason similar to that of the above case, the threshold voltage of each of the MOS transistors 192 and 193 constructing the inverter 197 is set to be low and the threshold voltage of each of the MOS transistors 194 and 195 is set to be higher than that. The ratio W/L of each of the MOS transistors 192 and 193 is set to 24/0.16, the ratio W/L of the MOS transistor 194 is set to 48/0.16, and the ratio W/L of the MOS transistor 195 is set to 1/0.16.

The case where the logic circuit according to the invention is applied to an output driver in a semiconductor storage device as an example of the semiconductor integrated circuit will now be described.

Figure 11:
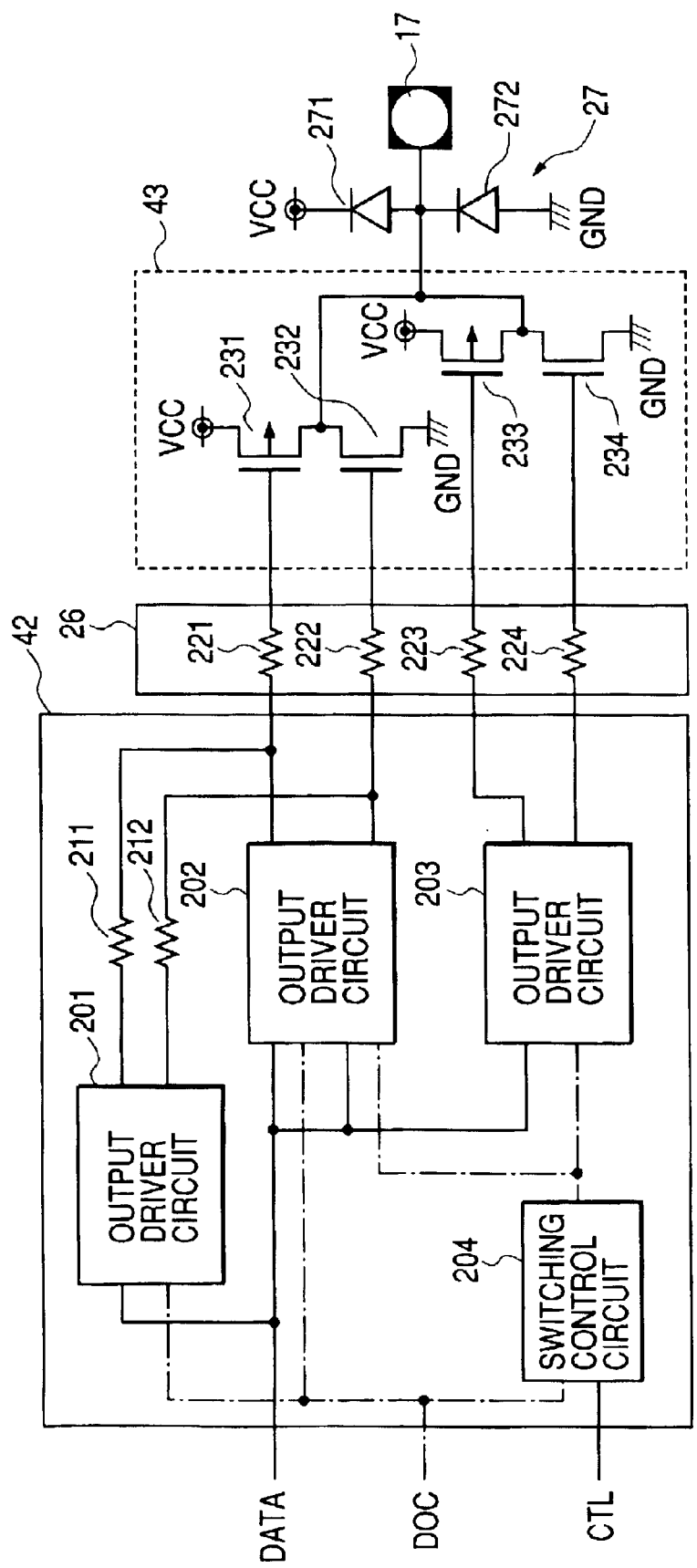
FIG. 11 is a circuit diagram showing an example of the configuration of an output circuit including an output driver and an output buffer to which the logic circuit according to the invention is applied.

FIG. 11 shows an output circuit including an output driver and an output buffer in a semiconductor storage device.

An output driver 42 includes, although not particularly limited, output driver circuits 201, 202, and 203, resistors 211 and 212 for damper connected to output terminals of the output driver circuits 201 and 202, and a switching control circuit 204 for switching the rising/falling characteristic of a signal wave output from an output buffer 43. The output drivers 201, 202, and 203 and the switching control circuit 204 are activated by a driver activate signal DOC transmitted from a chip controller 46. The output drivers 201, 202, and 203 drive the output buffer 43 on the basis of data DATA which is input in a state where the output drivers 201, 202, and 203 are activated by the driver activate signal DOC.

The output buffer 43 includes, although not particular limited, a first output driver formed by connecting a p-channel type MOS transistor 231 and an n-channel type MOS transistor 232 in series, and a second output driver formed by connecting a p-channel type MOS transistor 233 and an n-channel type MOS transistor 234 in series. The source electrodes of the p-channel type MOS transistors 231 and 233 are connected to the high-potential-side power source VCC and the source electrodes of the n-channel type MOS transistors 232 and 234 are connected to the ground GND.

A static-shielding device 26 is disposed between the output driver 42 and the output buffer 43. The static-shielding device 26 includes, although not particularly limited, resistors 221, 222, 223, and 224. A static-shielding device 27 disposed near a pad 17 for outputting a signal includes a diode 271 coupled to an output signal line of the output buffer 43 and the high-potential-side power source VCC and a diode 272 coupled to the output signal line of the output buffer 43 and the ground GND.

Figure 12:
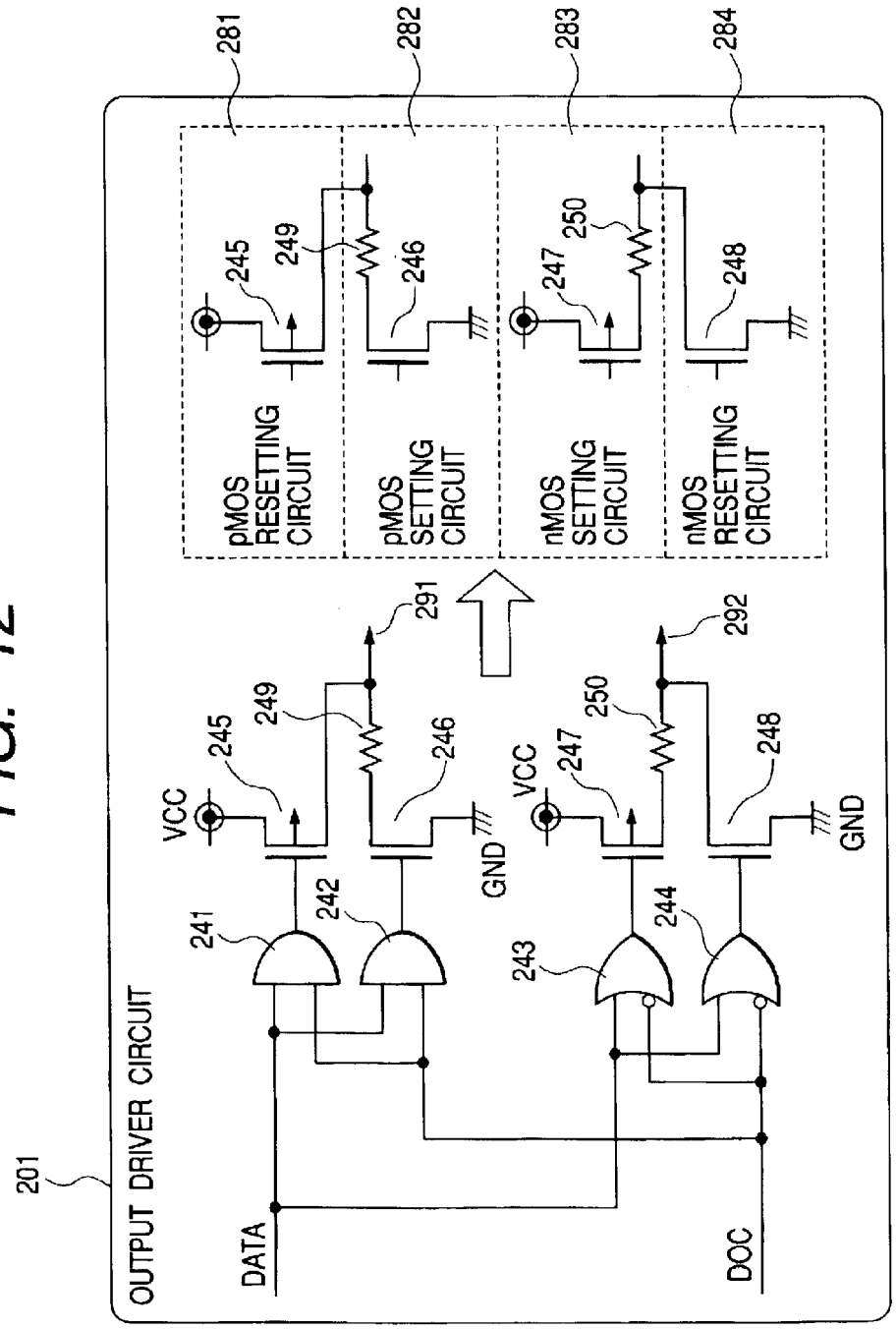
FIG. 12 is a circuit diagram showing an example of a detailed configuration of a main part of the output driver.

Each of the output driver circuits 201, 202, and 203 basically includes, as shown in FIG. 12, gate circuits 241, 242, 243, and 244, p-channel type MOS transistors 245 and 247, and n-channel type MOS transistors 246 and 248. The gate circuit 241 obtains the logic between the input data DATA and the driver activate signal DOC and the p-channel type MOS transistor 245 is driven in accordance with the logic output. The gate circuit 242 obtains the logic between the input data DATA and the driver activate signal DOC and drives the n-channel type MOS transistor 246 in accordance with the logic output. The gate circuit 243 obtains the logic between the input data DATA and the driver activate signal DOC and the p-channel type MOS transistor 247 is driven in accordance with the logic output. The gate circuit 244 obtains the logic between the input data DATA and the driver activate signal DOC and the n-channel type MOS transistor 248 is driven according to the logic output. The source electrodes of the p-channel type MOS transistors 245 and 247 are coupled to the high-potential-side power source VCC and the source electrodes of the n-channel type MOS transistors 246 and 248 are coupled to the ground GND. The output driver circuit has a first output terminal 291 and a second output terminal 292 for driving the output buffer 43 in an open drain form of an MOS transistor. Specifically, the drain electrode of the p-channel type MOS transistor 245 and the drain electrode of the n-channel type MOS transistor 246 are coupled to each other via a resistor 249, and the first output terminal 291 of the output driver circuit is led from a connection node between the drain electrode of the p-channel type MOS transistor 245 and the resistor 249. The drain electrode of the p-channel type MOS transistor 247 and the drain electrode of the n-channel type MOS transistor 248 are coupled to each other via a resistor 250, and the second output terminal 292 of the output driver circuit is led from a connection node between the drain electrode of the n-channel type MOS transistor 248 and the resistor 250.

The p-channel type MOS transistor 245 has a function of resetting the p-channel type MOS transistor by driving the gate electrode of the p-channel type MOS transistor 231 or 233 in the output buffer 43 to the high level. Consequently, the p-channel type MOS transistor 245 is called a "pMOS resetting circuit 281".

The n-channel type MOS transistor 246 and the resistor 249 have a function of setting the n-channel type MOS transistor by driving the gate electrode of the p-channel type MOS transistor 231 or 233 in the output buffer 43 to the low level. Consequently, the n-channel type MOS transistor 246 and the resistor 249 are called a "pMOS setting circuit 282".

The n-channel type MOS transistor 247 and the resistor 250 have a function of setting the n-channel type MOS transistor by driving the gate electrode of the n-channel type MOS transistor 232 or 234 in the output buffer 43 to the high level. Consequently, the n-channel type MOS transistor 247 and the resistor 250 are called an "nMOS setting circuit 283".

The p-channel type MOS transistor 248 has a function of resetting the n-channel type MOS transistor by driving the gate electrode of the n-channel type MOS transistor 232 or 234 in the output buffer 43 to the low level. Consequently, the n-channel type MOS transistor 248 is called an "nMOS resetting circuit 284".

The resistors 249 and 250 have the function of delaying driving of the output driver 43. By properly using a circuit including such a resistor and a circuit which does not include such a resistor on the basis of the driver activate signal DOC, the driving capability of the output driver 42 can be switched. By changing the number of MOS transistors related to the output operation in the output buffer 43 on the basis of the driver activate signal DOC, the output buffer driving size can be changed. For example, in order to comply with an LV-CMOS interface or LV-TTL interface, as shown in FIG. 13, it is preferable to properly use the pMOS resetting circuit 281, pMOS setting circuit 282, nMOS setting circuit 283, and nMOS resetting circuit 284 in the output driver circuits 201, 202, and 203 on the basis of the driver activate signal DOC. Specifically, in order to comply with the LV-CMOS interface, the output buffer 43 is driven at high speed by using the pMOS setting circuit 282 and nMOS setting circuit 283 in the output driver circuit 201 and all of setting circuits and resetting circuits in the output driver circuits 202 and 203. In the LV-CMOS interface, as obviously understood from FIG. 39, the noise margin 131 on the low level side and the noise margin 132 on the high level side are large. Consequently, by driving the output buffer 43 at high speed, a tr/tf value as the waveform rising/falling characteristic of an output signal from the output buffer 43 is reduced, and signal transmission time can be shortened.

On the other hand, in order to comply with the LV-TTL interface, the PMOS setting circuit 282 and nMOS setting circuit 283 in the output driver circuit 201 and the pMOS resetting circuit 281 and the nMOS resetting circuit 284 in the output driver circuit 202 are used. The other circuits are not related to the driving of the output buffer 43. By decreasing the driving capability of the output buffer 43 in such a manner, the output current from the output buffer 43 is reduced and noise included in the output waveform is reduced for the following reason. In the LV-TTL interface, the lower the level of the high-potential side power source VCC is, the smaller the noise margin on the low level side becomes. The higher the level of the high-potential side power source VCC is, the smaller the noise margin on the high level side becomes. Thus, noise included in an output signal has to be suppressed by driving the output buffer 43 at low speed.

Figure 14:
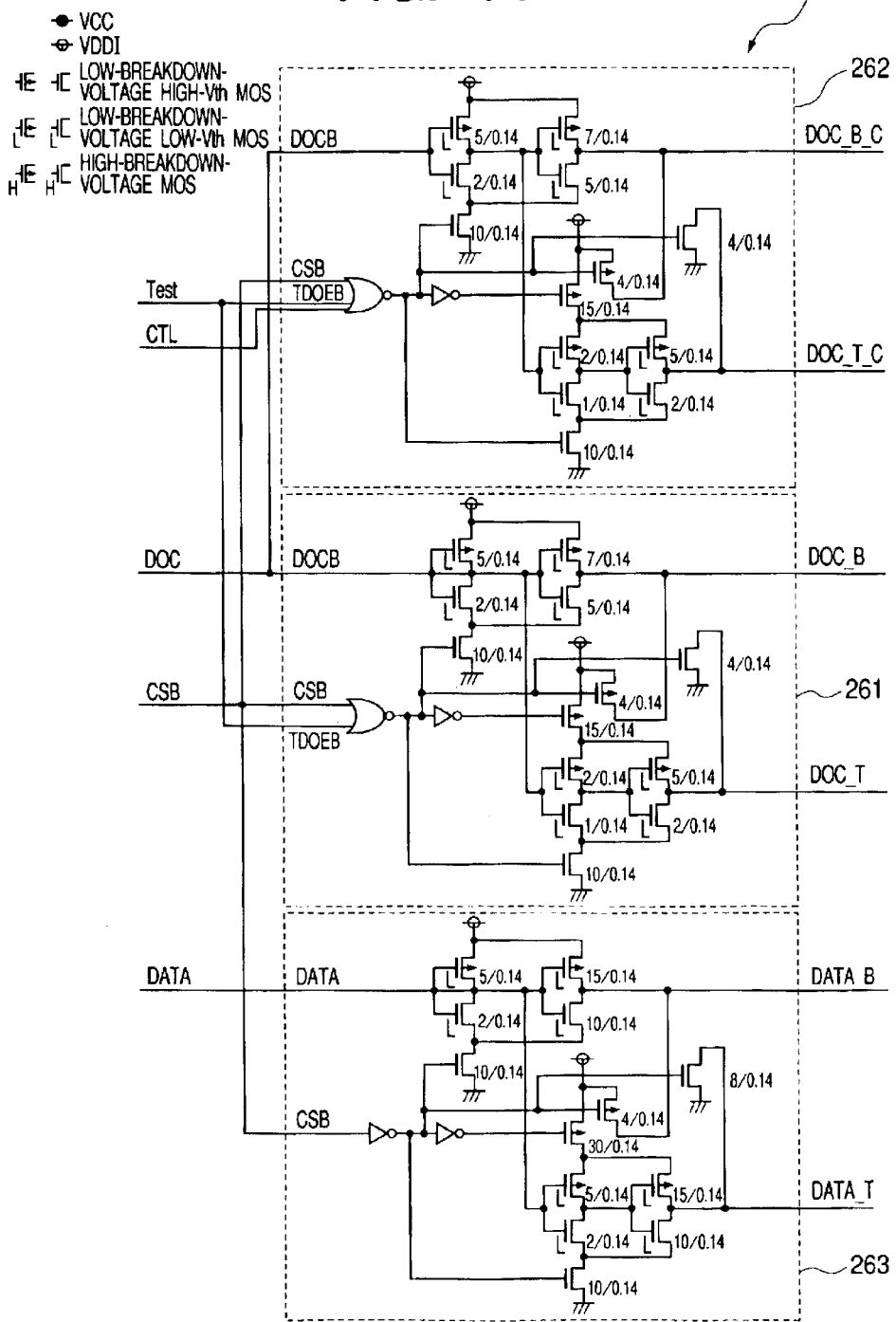
FIG. 14 is a circuit diagram showing an example of a detailed configuration of the main part of the output driver.
Figure 15:
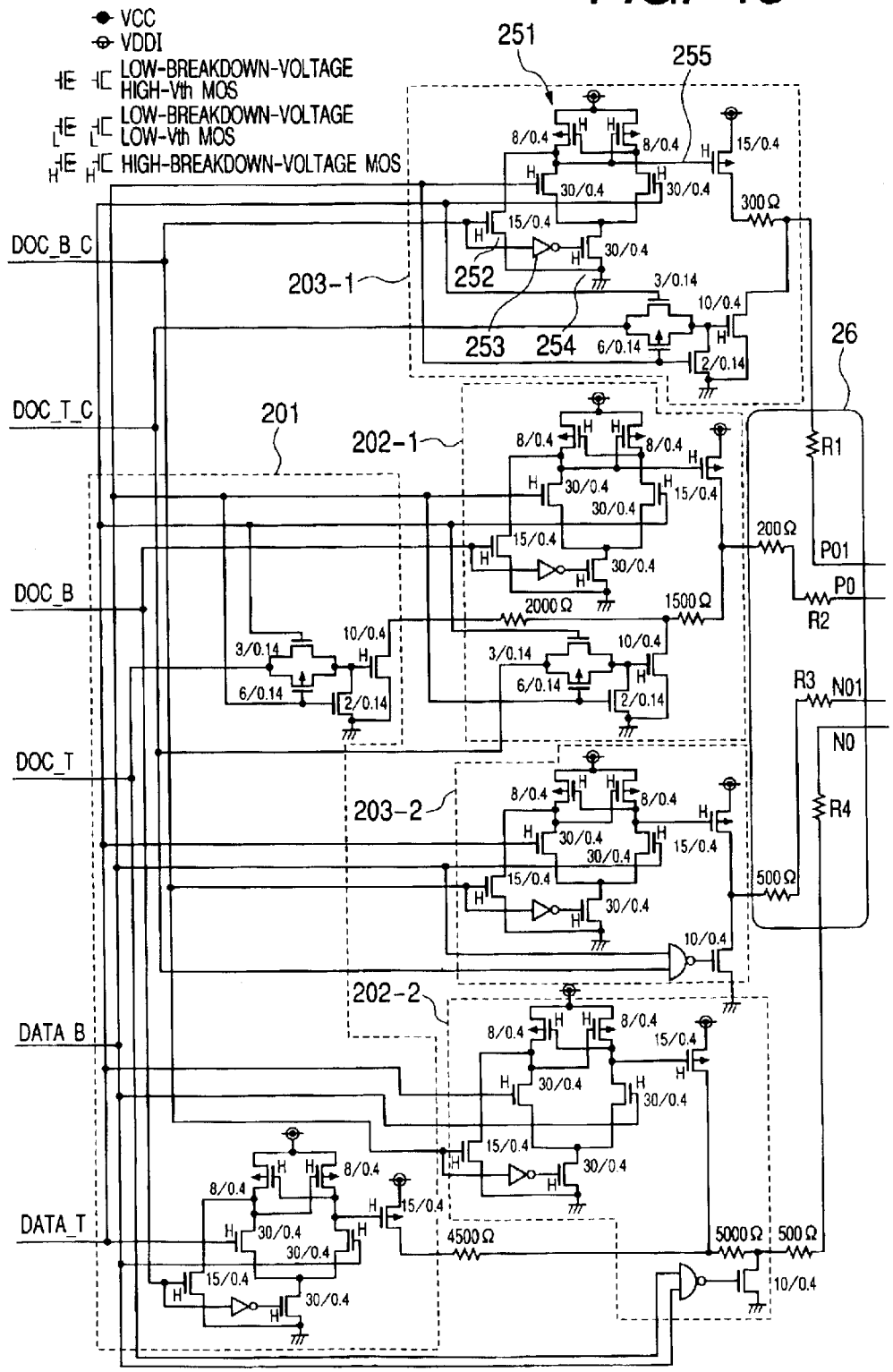
FIG. 15 is a circuit diagram showing an example of a detailed configuration of the main part of the output driver.
Figure 16:
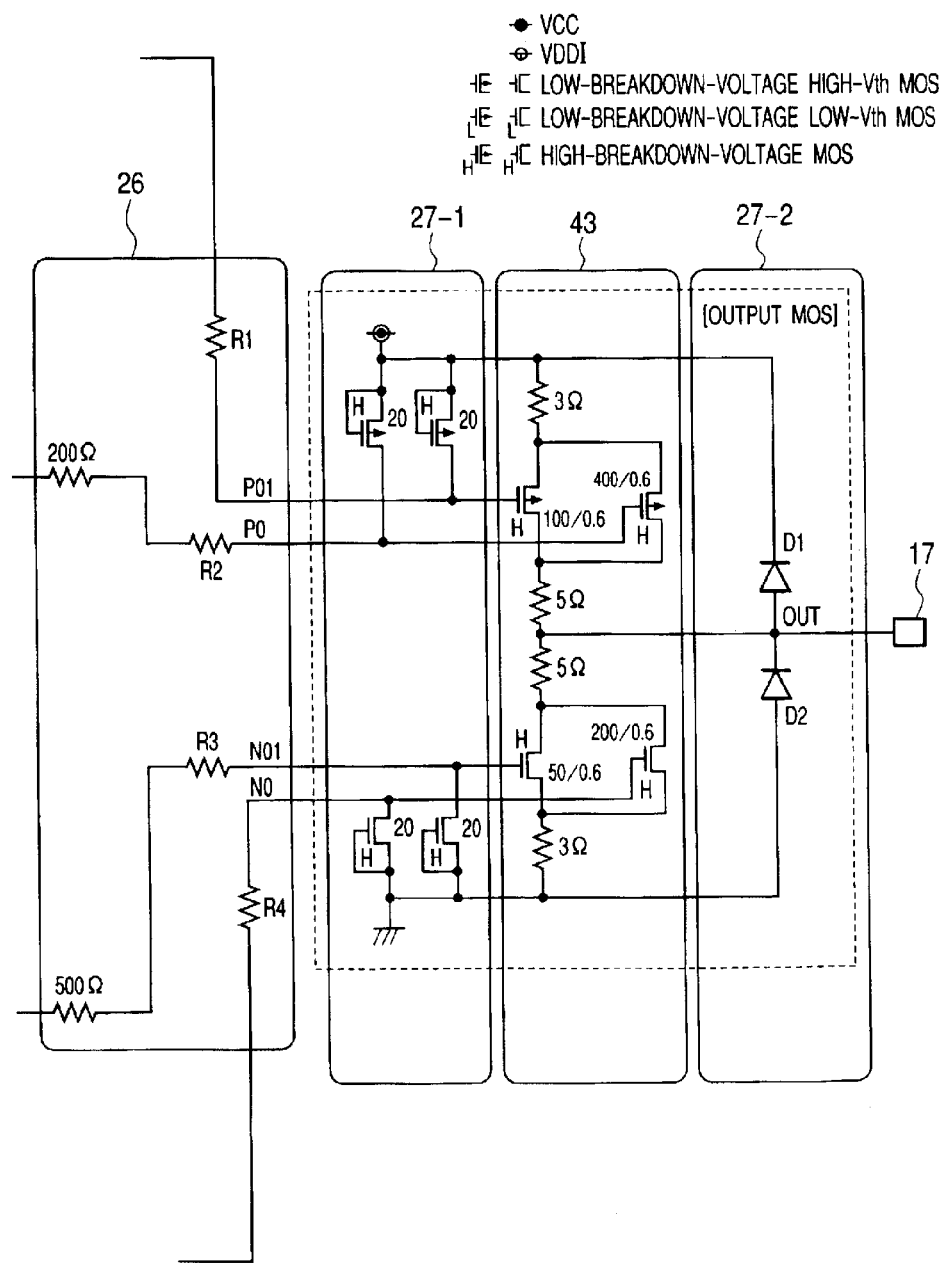
FIG. 16 is a circuit diagram showing an example of a detailed configuration of the output buffer and peripheral components.

FIGS. 14 to 16 show examples of a more detailed configuration of the output driver 42 and the output buffer 43.

Near each of the MOS transistors shown in FIGS. 14 to 16, the W/L ratio of the corresponding MOS transistor is indicated.

As shown in FIG. 14, the switching control circuit 204 includes a first DOC driver 262, a second DOC driver 261, and a data driver 263. Output signals DOC_B_C, DOC_T_C, DOC_B, DOC_T, DATA_B, and DATA_T from the first DOC driver 262, second DOC driver 261, and data driver 263 are transmitted to output driver circuits 201, 202-1, 202-2, 203-1, and 203-2 shown in FIG. 15. The output driver circuits 202-1 and 202-2 in FIG. 15 correspond to the output driver circuit 202 in FIG. 11, and the output driver circuits 203-1 and 203-2 in FIG. 15 correspond to the output driver circuit 203 in FIG. 11. Output signals of the output driver circuits 201, 202-1, 202-2, 203-1, and 203-2 are transmitted to the output buffer 43 shown in FIG. 16 via the static-shielding device 26. In the ante and post stages of the output buffer 43, static-shielding devices 27-1 and 27-2 are disposed, respectively. The static-shielding devices 27-1 and 27-2 correspond to the static-shielding device 27 in FIG. 11. Since a MOS transistor included in the output buffer 43 has to drive an external load, a MOS transistor having a gate size ratio (W/L) higher as compared with the other MOS transistors such as the 100/0.6, 200/0.6, or the like is employed.

As shown in FIG. 15, in the switching control circuit 204 and output driver circuits 201, 202-1, 202-2, 203-1, and 203-2, a number of logic circuits according to the invention are employed.

For example, the output driver circuit 203-1 includes an n-channel type MOS transistor 254 capable of interrupting power supply to a logic gate 251, an n-channel type MOS transistor 252 capable of fixing an output node 255 of the logic gate 251 to the low level interlockingly with the power supply interrupting operation performed by the n-channel type MOS transistor 254, and an inverter 253 for complementarily turning on the n-channel type MOS transistors 252 and 254. For a reason similar to the above case, the threshold voltage of each of the MOS transistors constructing the logic gate 251 is set to be low, and the threshold voltage of each of the MOS transistors 252 and 254 and the MOS transistors forming the inverter 253 is set to be high.

FIG. 17 shows a truth table of the main part of the output driver 42 and the output buffer 43 in FIGS. 14 to 16. In FIG. 17, "L" indicates the low level, "H" indicates the high level, "HZ" denotes a high impedance state, and "X" expresses that the logic is undefined.

Although the invention achieved by the inventor herein has been concretely described above, obviously, the invention is not limited to the embodiments but can be variously changed without departing from the gist.

For example, the invention is not limited to the decoder shown in FIG. 8, the clock driver shown in FIGS. 9 and 10, the output driver shown in FIGS. 14 to 16, and the like but can be carried out by properly modifying the transistor for interrupting the power supply, and the conductivity and connection part of the transistor for fixing the logic of the output node in a manner similar to the logic circuit shown in FIGS. 1 to 3 and FIGS. 5 and 6.

Although the case where the invention achieved by the inventor herein has been applied to the decoder, clock driver circuit, and output driver which are in the field of utilization as the background of the invention has been described above, the invention is not limited to the case but can be applied to various electronic circuits.

The invention can be applied under condition that an electronic circuit includes at least the logic gate.

Effects produced by representative ones of inventions disclosed in the specification will be briefly described as follows.

In the standby mode or the like, the power supply to the logic gate is interrupted by the first transistor and the output node of the logic gate is fixed to the high level by the second transistor interlockingly with the power supply interrupting operation. Consequently, the circuit for fixing the output logic of the logic gate while suppressing the subthreshold current can be constructed by the first and second transistors, thereby enabling the circuit to be simplified.

Since the power supply to the logic gate is interrupted by the first transistor and the output node of the logic gate is fixed to the low level by the second transistor interlockingly with the power supply interrupting operation, the circuit for fixing the output logic of the logic gate while suppressing the subthreshold current can be constructed by the first and second transistors, thereby enabling the circuit to be simplified.

What is claimed is:

1. A logic circuit comprising:
   a logic gate including a first power supply terminal to which a high-potential-side power is supplied, a second power supply terminal to which a low-potential-side power is supplied, and a transistor which can operate by power supplied from said first and second power supply terminals;
   an n-channel type first transistor provided between said second power supply terminal and said low-potential-side power and capable of interrupting power supply to said logic gate in accordance with an input control signal; and
   a p-channel type second transistor provided between said high-potential-side power and an output node of said logic gate and capable of fixing the output node of said logic gate to the high level relating to said power supply interrupting operation of said first transistor,
   wherein a threshold voltage of each of said first and second transistors is set to be higher than that of the transistor as a component of said logic gate.

2. A logic circuit comprising:
   a logic gate including a first power supply terminal to which a high-potential-side power is supplied, a second power supply terminal to which a low-potential-side power is supplied, and a transistor which can operate by power supplied from said first and second power supply terminals;
   an n-channel type first transistor provided between said second power supply terminal and said low-potential-side power and capable of interrupting power supply to said logic gate in accordance with an input control signal; and
   an n-channel type second transistor provided between said low-potential-side power and an output node of said logic gate and capable of fixing the output node of said logic gate to the low level interlockingly with said power supply interrupting operation of said first transistor,
   wherein a threshold voltage of each of said first and second transistors is set to be higher than that of the transistor as a component of said logic gate.

3. The logic circuit according to claim 1, wherein the second power supply terminal in said logic gate includes a plurality of terminals which are independent of each other in accordance with an internal configuration of said logic gate, and said first transistor includes a plurality of transistors disposed in correspondence with said plurality of terminals.

4. A logic circuit comprising:
   a logic, gate including a first power supply terminal to which a high-potential-side power is supplied, a second power supply terminal to which a low-potential-side power is supplied, and a transistor which can operate by power supplied from said first and second power supply terminals;
   a p-channel type first transistor provided between said first power supply terminal and said high-potential-side power and capable of interrupting power supply to said logic gate in accordance with an input control signal; and
   an n-channel type second transistor provided between said low-potential-side power and an output node of said logic gate and capable of fixing the output node of said logic gate to the low level interlockingly with said power supply interrupting operation of said first transistor,
   wherein a threshold voltage of each of said first and second transistors is set to be higher than that of a transistor as a component of said logic gate.

5. The logic circuit according to claim 1, wherein said logic gate includes an NOR circuit having on output connected to said output node.

6. The logic circuit according to claim 1,
   wherein said logic circuit is included in a semiconductor device, said semiconductor device includes a decoding wire group for decoding an input address signal and a plurality of decode logic circuits for obtaining a decoded output according to a logic signal of said decoding wiring group, and
   wherein said plurality of decode logic circuits include said logic circuits.

7. The logic circuit according to claim 1,
   wherein said logic circuit is included in a semiconductor device, said semiconductor device includes a clock driver circuit, said clock driver circuit includes a plurality of clock drivers each having a clock input terminal for receiving a clock signal and a selection signal input terminal for receiving a selection signal, and
   wherein each of said plurality of clock drivers includes said logic circuit, a clock signal which is input via said clock input terminal is input to said logic gate, and a selection signal which is input via said selection signal input terminal is transmitted as said control signal to said first transistor.

8. The logic circuit according to claim 1,
wherein said logic circuit is included in a semiconductor device, said semiconductor device includes an output buffer for outputting signals and an output driver for driving said output buffer in accordance with input data, and
wherein said output driver includes said logic circuit.

9. The logic circuit according to claim 1,
wherein said logic circuit is included in a semiconductor device, said semiconductor device includes an output buffer for outputting a signal and an output buffer for driving said output buffer in accordance with input data,
wherein said output driver includes a plurality of output driver circuits, and a switching control circuit for switching a rising/falling characteristic of a signal waveform which is output from said output buffer by controlling said output driver circuits, and
wherein said output driver circuit and said switching control circuit include said logic circuit.

10. A semiconductor device comprising:
a first voltage terminal for receiving a first voltage;
a second voltage terminal for receiving a second voltage larger than said first voltage;
a logic circuit including a first terminal, a second terminal connected to said second voltage terminal, an output terminal, a first N-type transistor, and a first P-type transistor;
a second N-type transistor having a source-drain path connected between said first voltage terminal and said first terminal and a gate for receiving a control signal; and
a second P-type transistor having a source-drain path connected between said second voltage terminal and said output terminal and a gate for receiving said control circuit,
wherein a threshold voltage of said second N-type transistor is larger than a threshold voltage of said first N-type transistor, and
wherein a threshold voltage of said second P-type transistor is larger than a threshold voltage of said first P-type transistor.

11. A semiconductor device comprising;
a first voltage terminal for receiving a first voltage;
a second voltage terminal for receiving a second voltage larger than said first voltage;
a logic circuit including a first terminal connected to said first voltage terminal, a second terminal, an output terminal, a first N-type transistor, and a first P-type transistor;
a second P-type transistor having a source-drain path connected between said second voltage terminal and said second terminal and a gate for receiving a control signal; and
a second N-type transistor having a source-drain path connected between said first voltage terminal and said output terminal and a gate for receiving said control signal,
wherein a threshold voltage of said second N-type transistor is larger than a threshold voltage of said first N-type transistor, and
wherein a threshold voltage of said second P-type transistor is larger than a threshold voltage of said first P-type transistor.

12. The semiconductor device according to claim 10,
wherein said logic circuit includes an NOR circuit connected to said output terminal, and
wherein said NOR circuit includes said first N-type transistor and said first P-type transistor.

13. The semiconductor device according to claim 10,
wherein said second N-type transistor is a transistor for reducing a subthreshold current of said logic circuit, and
wherein said second P-type transistor is a transistor for fixing a potential of said output terminal of said logic circuit to said second voltage.

14. The semiconductor device according to claim 11,
wherein said second P-type transistor is a transistor for reducing a subthreshold current of said logic circuit, and
wherein said second N-type transistor is a transistor for fixing a potential of said output terminal of said logic circuit to said first voltage.

15. The semiconductor device according to claim 10, further comprising a data output terminal and a data output circuit connected to said data output terminal;
wherein said data output circuit includes said logic circuit.

16. The logic circuit according to claim 2, wherein the second power supply terminal in said logic gate includes a plurality of terminals which are independent of each other in accordance with an internal configuration of said logic gate, and said first transistor includes a plurality of transistors disposed in correspondence with said plurality of terminals.

17. The logic circuit according to claim 2, wherein said logic gate includes an NOR circuit having an output connected to said output node.

18. The logic circuit according to claim 4, wherein said logic gate includes an NOR circuit having an output connected to said output node.

19. The logic circuit according to claim 2,
wherein said logic circuit is included in a semiconductor device, said semiconductor device includes a decoding wire group for decoding an input address signal and a plurality of decode logic circuits for obtaining a decoded output according to a logic signal of said decoding wiring group, and
wherein said plurality of decode logic circuits include said logic circuits.

20. The logic circuit according to claim 4,
wherein said logic circuit is included in a semiconductor device, said semiconductor device includes a decoding wire group for decoding an input address signal and a plurality of decode logic circuits for obtaining a decoded output according to a logic signal of said decoding wiring group, and
wherein said plurality of decode logic circuits include said logic circuits.

21. The logic circuit according to claim 2,
wherein said logic circuit is included in a semiconductor device, said semiconductor device includes a clock driver circuit, said clock driver circuit includes a plurality of clock drivers each having a clock input terminal for receiving a clock signal and a selection signal input terminal for receiving a selection signal, and
wherein each of said plurality of clock drivers includes said logic circuit, a clock signal which is input via said clock input terminal is input to said logic gate, and a selection signal which is input via said selection signal input terminal is transmitted as said control signal to said first transistor.

22. The logic circuit according to claim 4, wherein said logic circuit is included in a semiconductor device, said semiconductor device includes a clock driver circuit, said clock driver circuit includes a plurality of clock drivers each having a clock input terminal for receiving a clock signal and a selection signal input terminal for receiving a selection signal, and wherein each of said plurality of clock drivers includes said logic circuit, a clock signal which is input via said clock input terminal is input to said logic gate, and a selection signal which is input via said selection signal input terminal is transmitted as said control signal to said first transistor.

23. The logic circuit according to claim 2, wherein said logic circuit is included in a semiconductor device, said semiconductor device includes an output buffer for outputting signals and an output driver for driving said output buffer in accordance with input data, and wherein said output driver includes said logic circuit.

24. The logic circuit according to claim 4, wherein said logic circuit is included in a semiconductor device, said semiconductor device includes an output buffer for outputting signals and an output driver for driving said output buffer in accordance with input data, and wherein said output driver includes said logic circuit.

25. The logic circuit according to claim 2, wherein said logic circuit is included in a semiconductor device, said semiconductor device includes an output buffer for outputting a signal and an output buffer for driving said output buffer in accordance with input data, wherein said output driver includes a plurality of output driver circuits, and a switching control circuit for switching a rising/falling characteristic of a signal waveform which is output from said output buffer by controlling said output driver circuits, and wherein said output driver circuit and said switching control circuit include said logic circuit.

26. The logic circuit according to claim 4, wherein said logic circuit is included in a semiconductor device, said semiconductor device includes an output buffer for outputting a signal and an output buffer for driving said output buffer in accordance with input data, wherein said output driver includes a plurality of output driver circuits, and a switching control circuit for switching a rising/falling characteristic of a signal waveform which is output from said output buffer by controlling said output driver circuits, and wherein said output driver circuit and said switching control circuit include said logic circuit.

27. The semiconductor device according to claim 11, wherein said logic circuit includes an NOR circuit connected to said output terminal, and wherein said NOR circuit includes said first N-type transistor and said first P-type transistor.

28. The semiconductor device according to claim 11, further comprising a data output terminal and a data output circuit connected to said data output terminal, wherein said data output circuit includes said logic circuit.

* * * * *